(12) United States Patent
Chou et al.

(10) Patent No.: US 7,924,083 B2
(45) Date of Patent: Apr. 12, 2011

(54) ISOLATION CIRCUIT

(75) Inventors: Yung-Fa Chou, Kaohsiung (TW);
Ding-Ming Kwai, Hualien County (TW)

(73) Assignee: Industrial Technology Research Institute, Hsinchu (TW)

( * ) Notice: Subject to any disclaimer, the term of this patent is extended or adjusted under 35 U.S.C. 154(b) by 73 days.

(21) Appl. No.: 12/551,551

(22) Filed: Aug. 31, 2009

(65) Prior Publication Data

US 2011/0006829 A1 Jan. 13, 2011

(30) Foreign Application Priority Data

Jul. 13, 2009 (TW) ............................... 98123607 A

(51) Int. Cl.
*H03K 17/16* (2006.01)

(52) U.S. Cl. ........ 327/391; 327/389; 327/427; 327/436; 327/437

(58) Field of Classification Search ........................ None
See application file for complete search history.

(56) References Cited

U.S. PATENT DOCUMENTS

| | | | |
|---|---|---|---|
| 5,914,627 A | 6/1999 | Fotouhi | |
| 5,973,511 A | 10/1999 | Hsia et al. | |
| 6,163,199 A * | 12/2000 | Miske et al. | 327/434 |
| 6,670,829 B1 | 12/2003 | Chow | |
| 6,700,431 B1 * | 3/2004 | Fotouhi et al. | 327/404 |
| 6,704,826 B1 | 3/2004 | Lam et al. | |
| 6,724,226 B2 * | 4/2004 | Kim | 327/108 |
| 6,828,846 B2 * | 12/2004 | Tsukazaki et al. | 327/404 |
| 7,388,410 B2 * | 6/2008 | Kim et al. | 327/108 |
| 7,667,525 B2 * | 2/2010 | Grimone, III | 327/427 |
| 2007/0194832 A1* | 8/2007 | Miske et al. | 327/427 |
| 2009/0058496 A1* | 3/2009 | Kapoor | 327/391 |

* cited by examiner

*Primary Examiner* — Tuan Lam
(74) *Attorney, Agent, or Firm* — Jianq Chyun IP Office

(57) ABSTRACT

An isolation circuit is provided. The isolation circuit is coupled to an output and an input node and includes a first set, a second switch set, and a body bias voltage generator. The first switch set couples a switch control node to a second voltage when a first voltage is at a first voltage level, and couples the switch control node to the input node when the first voltage is at a second voltage level. The second switch set couples the output node to the input node when the first voltage is at the first voltage level, and isolates the output node from the input node when the first voltage is at the second voltage level. The body bias voltage generator selectively provides a higher one of the first voltage and a voltage on the input node to a body of the second switch set.

21 Claims, 4 Drawing Sheets

US 7,924,083 B2

ISOLATION CIRCUIT

CROSS-REFERENCE TO RELATED APPLICATION

This application claims the priority benefit of Taiwan application serial no. 98123607, filed on Jul. 13, 2009. The entirety of the above-mentioned patent application is hereby incorporated by reference herein and made a part of specification.

TECHNICAL FIELD

The present invention relates to an isolation circuit.

BACKGROUND

FIG. 1 is a schematic diagram of a conventional isolation circuit 150. The isolation circuit 150 is coupled between a first circuit 110 and a second circuit 190. The isolation circuit 150 includes a P-type transistor 152 and an N-type transistor 154. The isolation circuit 150 can selectively couple or isolate the first circuit 110 and the second circuit 190 according to a signal S1 and a signal S2.

However, the conventional isolation circuit 150 probably cannot assuredly couple (or assuredly isolate) the first circuit 110 and the second circuit 190 due to characteristics of the P-type transistor 152 and the N-type transistor 154. For example, when the first circuit 110 and the second circuit 190 are required to be coupled, a signal transmitted between the first circuit 110 and the second circuit 190 can be probably truncated due to a body effect of the P-type transistor 152 and/or the N-type transistor 154.

When the first circuit 110 and the second circuit 190 are required to be isolated, the P-type transistor 152 and/or the N-type transistor 154 probably form a leakage path for leaking the signal from the first circuit 110 to the second circuit 190 or from the second circuit 190 to the first circuit 110.

SUMMARY

The present disclosure provides an isolation circuit. The isolation circuit is coupled between an output node of a first circuit and an input node of a second circuit. The first circuit is powered by a first voltage and a second voltage. The isolation circuit includes a first switch, a second switch, a third switch and a body bias voltage generator. A first terminal of the first switch is coupled to the input node of the second circuit, and a control terminal thereof is coupled to the first voltage. A first terminal of the second switch is coupled to a second terminal of the first switch, a second terminal thereof is coupled to the second voltage, and a control terminal thereof is coupled to the first voltage. A first terminal and a second terminal of the third switch are respectively coupled to the output node of the first circuit and the input node of the second circuit, and a control terminal thereof is coupled to the second terminal of the first switch. The body bias voltage generator is coupled to the first voltage and the input node of the second circuit, and selectively provides a higher one of the first voltage and a voltage on the input node of the second circuit to a body of the third switch.

The present disclosure provides an isolation circuit. The isolation circuit is coupled between an output node of a first circuit and an input node of a second circuit. The first circuit is powered by a first voltage and a second voltage. The isolation circuit includes a first switch set, a second switch set, and a body bias voltage generator. The first switch set is coupled to the first voltage and the input node of the second circuit, and is used for coupling a switch control node to the second voltage when the first voltage is at a first voltage level, and coupling the switch control node to the input node of the second circuit when the first voltage is at a second voltage level. The second switch set is coupled between the output node of the first circuit and the input node of the second circuit, wherein the second switch set is controlled by the switch control node to determine whether or not to isolate the output node of the first circuit from the input node of the second circuit. The body bias voltage generator is coupled to the first voltage and the input node of the second circuit, and selectively provides a higher one of the first voltage and a voltage on the input node of the second circuit to a body of the second switch set.

In order to make the aforementioned and other features and advantages of the present invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
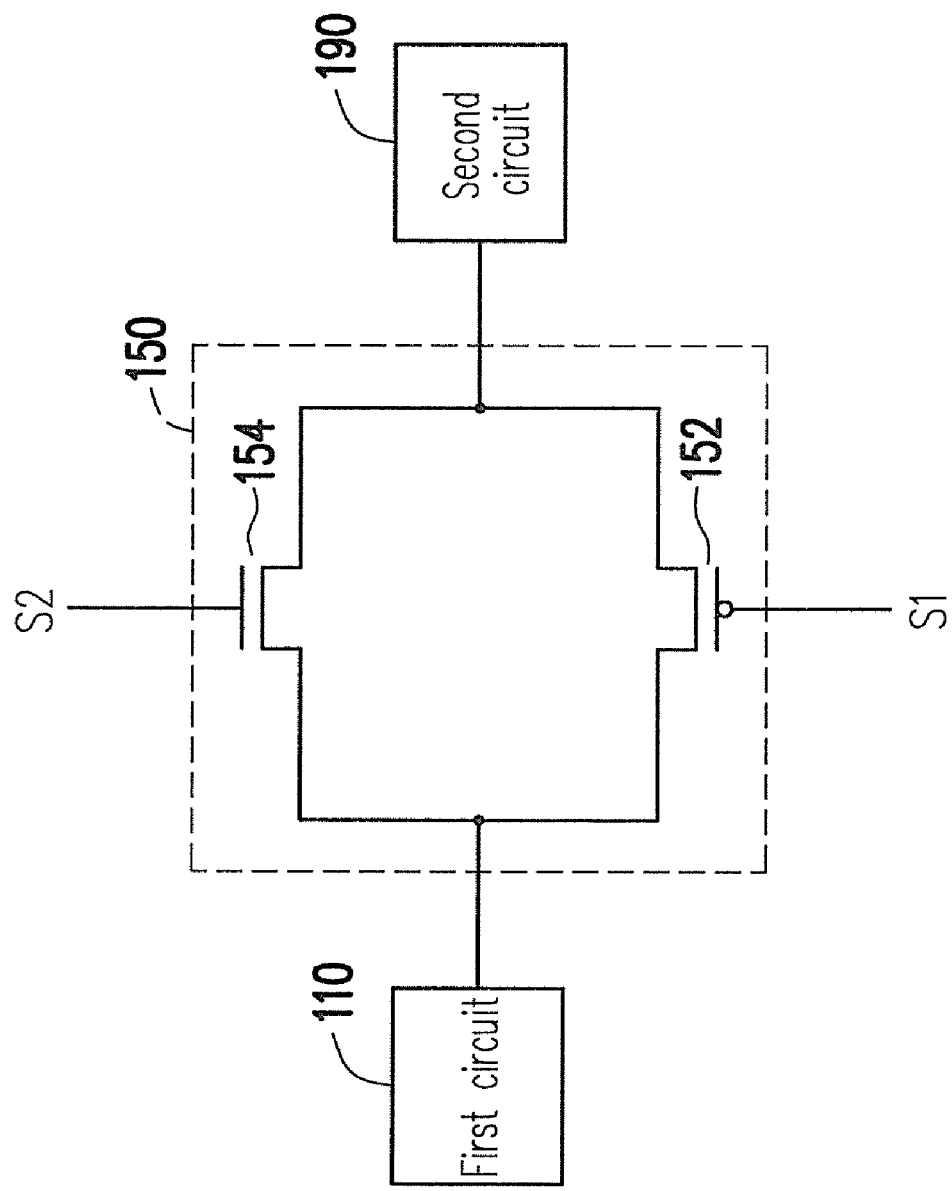
FIG. 1 is a schematic diagram of a conventional isolation circuit 150.

Reference will now be made in detail to the present preferred embodiments of the invention, examples of which are illustrated in the accompanying drawings. Wherever possible, the same reference numbers are used in the drawings and the description to refer to the same or like parts.

Figure 2:
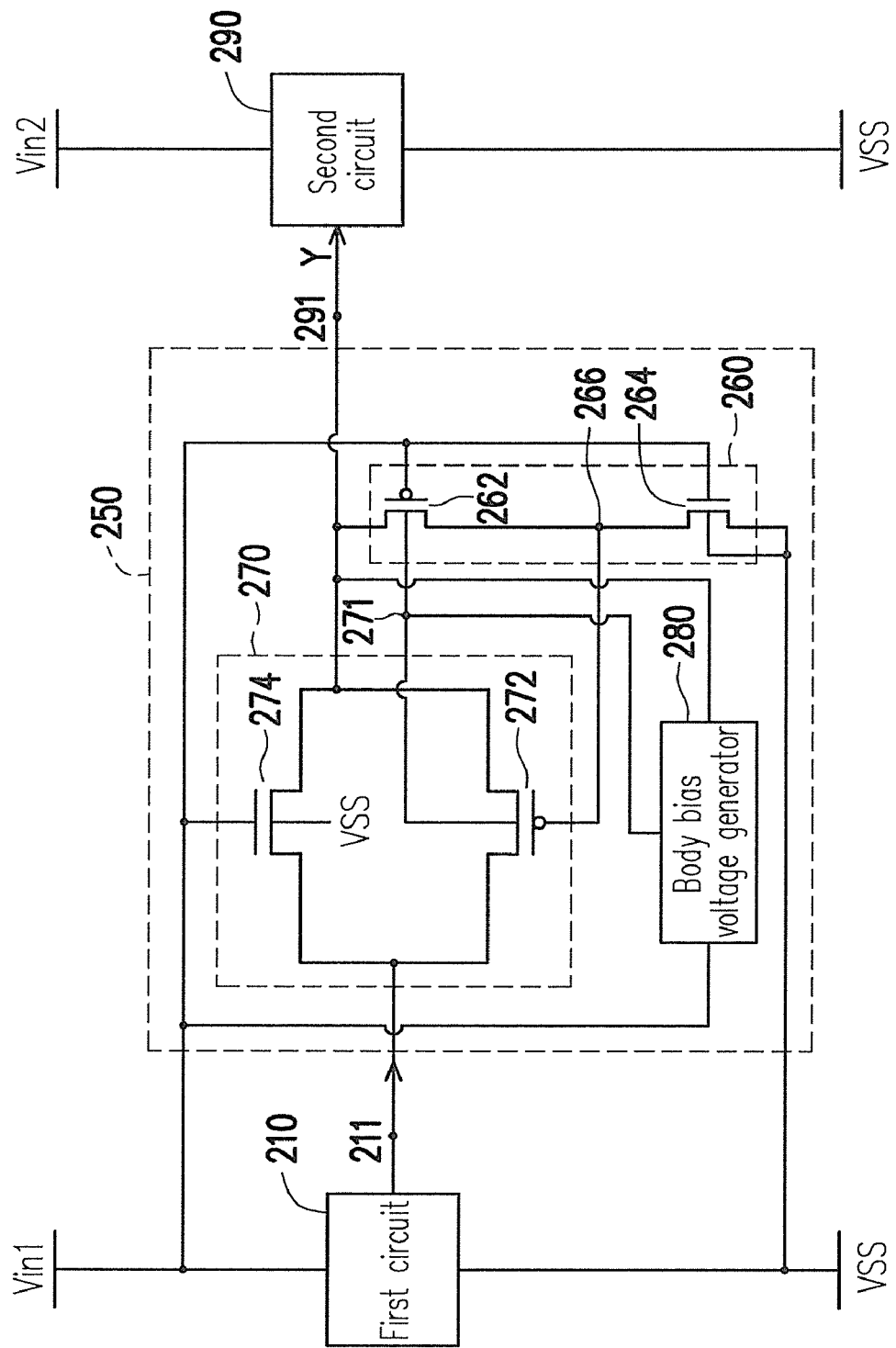
FIG. 2 is a schematic diagram illustrating an isolation circuit according to an exemplary embodiment.

Referring to FIG. 2, FIG. 2 is a schematic diagram illustrating an isolation circuit according to an exemplary embodiment. The isolation circuit 250 is coupled between an output node 211 of a first circuit 210 and an input node 291 of a second circuit 290. The first circuit 210 is powered by a first voltage Vin1 and a second voltage. The second circuit 290 is powered by a third voltage Vin2 and the second voltage. In the present embodiment, the first voltage Vin1 and the third voltage Vin2 can be a system voltage VDD, and the second voltage can be a ground voltage VSS. Functions of the isolation circuit 250 are: (1) when the first voltage Vin1 is equal to the system voltage VDD required for normal operation of the first circuit 210, so that the first circuit 210 is normally operated, the isolation circuit 250 couples the output node 211 of the first circuit 210 to the input node 291 of the second circuit 290; (2) when the first voltage Vin1 is cut off (for example, the first voltage Vin1 is equal to the ground voltage VSS) to turn off the first circuit 210, the isolation circuit 250 isolates the output node 211 of the first circuit 210 from the input node 291 of the second circuit 290. Therefore, an input signal Y on the input node 291 cannot be leaked into the first circuit 210 through the output node 211.

Therefore, the isolation circuit 250 includes a first switch set 260, a second switch set 270, and a body bias voltage generator 280. The first switch set 260 is coupled to the first voltage Vin1 and the input node 291 of the second circuit 290. When the first voltage Vin1 is at a first voltage level (for example, the first voltage Vin1 is equal to the system voltage VDD), the first switch set 260 couples a switch control node 266 to the second voltage (for example, the ground voltage VSS). When the first voltage Vin1 is at a second voltage level (for example, the first voltage Vin1 is equal to the ground voltage VSS), the first switch set 260 couples the switch control node 266 to the input node 291 of the second circuit 290.

The second switch set 270 is coupled between the output node 211 of the first circuit 210 and the input node 291 of the second circuit 290, wherein the second switch set 270 is controlled by the first voltage Vin1 and a voltage on the switch control node 266, and determines whether or not to isolate the output node 211 of the first circuit 210 from the input node 291 of the second circuit 290.

Therefore, when the first voltage Vin1 is at the first voltage level (for example, the first voltage Vin1 is equal to the system voltage VDD), the switch control node 266 is coupled to the second voltage and has the second voltage level (for example, the ground voltage VSS), so that second switch set 270 couples the output node 211 of the first circuit 210 to the input node 291 of the second circuit 290. When the first voltage Vin1 is at the second voltage level (for example, the first voltage Vin1 is equal to the ground voltage VSS), the switch control node 266 is coupled to the input node 291, so that the second switch set 270 isolates the output node 211 of the first circuit 210 from the input node 291 of the second circuit 290.

The body bias voltage generator 280 is coupled to the first voltage Vin1 and the input node 291 of the second circuit 290. The body bias voltage generator 280 selectively provides a higher one of the first voltage Vin1 and a voltage Y on the input node 291 to bodies of the first switch set 260 and the second switch set 270.

To implement the aforementioned function of the first switch set 260, the first switch set 260 of the present embodiment includes a first switch 262 and a second switch 264. A first terminal (an upper end of the first switch 262 in FIG. 2) of the first switch 262 is coupled to the input node 291 of the second circuit 290, and a control terminal (a right end of the first switch 262 in FIG. 2) of the first switch 262 is coupled to the first voltage Vin1. A first terminal (an upper end of the second switch 264 in FIG. 2) and a second terminal (a lower end of the second switch 264 in FIG. 2) of the second switch 264 are respectively coupled to a second terminal (a lower end of the first switch 262 in FIG. 2) of the first switch 262 and the second voltage VSS, and a control terminal (a right end of the second switch 264 in FIG. 2) of the second switch 264 is coupled to the first voltage Vin1.

In the present embodiment, the first switch 262 is a P-type transistor, and the second switch 264 is an N-type transistor. A body of the first switch 262 is coupled to a body bias voltage node 271 for receiving a body voltage provided by the body bias voltage generator 280. A body of the second switch 264 is coupled to the ground voltage VSS.

To implement the aforementioned function of the second switch set 270, the second switch set 270 of the present embodiment includes a third switch 272 and a fourth switch 274. A first terminal (a left end of the third switch 272 in FIG. 2) and a second terminal (a right end of the third switch 272 in FIG. 2) of the third switch 272 are respectively coupled to the output node 211 of the first circuit 210 and the input node 291 of the second circuit 290, and a control terminal (a lower end of the third switch 272 in FIG. 2) of the third switch 272 is coupled to the switch control node 266. A first terminal (a left end of the fourth switch 274 in FIG. 2) and a second terminal (a right end of the fourth switch 274 in FIG. 2) of the fourth switch 274 are respectively coupled to the output node 211 of the first circuit 210 and the input node 291 of the second circuit 290, and a control terminal (an upper end of the fourth switch 274 in FIG. 2) of the fourth switch 274 is coupled to the first voltage Vin1.

In the present embodiment, the third switch 272 is a P-type transistor, and the fourth switch 274 is an N-type transistor. A body of the third switch 272 is coupled to the body bias voltage node 271 for receiving the body voltage provided by the body bias voltage generator 280. A body of the fourth switch 274 is coupled to the ground voltage VSS.

Generally, a body of a P-type transistor is required to be coupled to a positive bias. To ensure normal operations of the first switch 262 and the third switch 272 in case that the first voltage Vin1 is at a low voltage level, the body bias voltage generator 280 provides the positive bias for the bodies of the first switch 262 and the third switch 272.

Figure 3B:
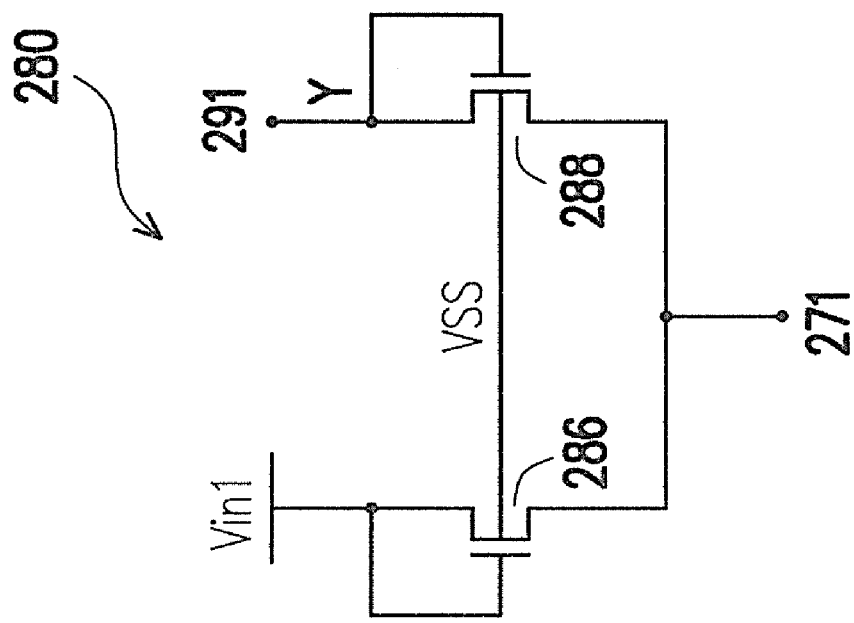
FIG. 3A and FIG. 3B are schematic diagrams illustrating two embodiments of a body bias voltage generator of FIG. 2.
Figure 3A:
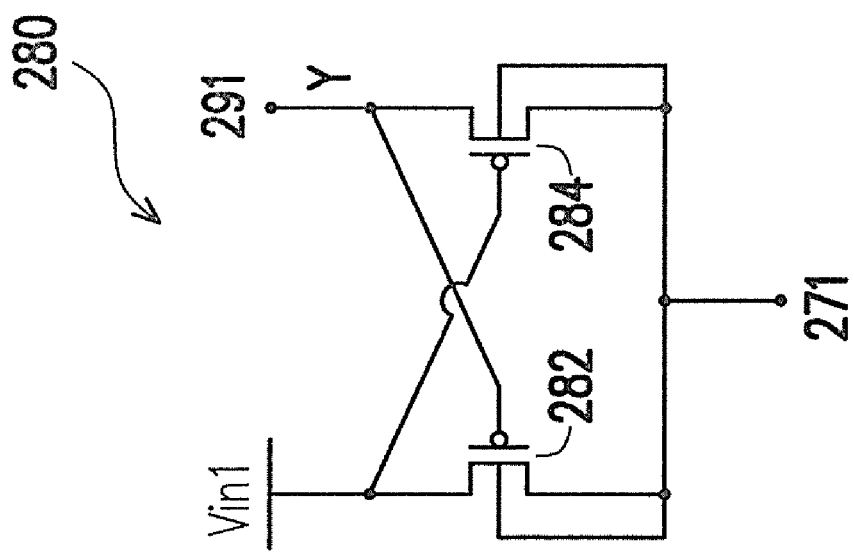

FIG. 3A and FIG. 3B are schematic diagrams illustrating two embodiments of the body bias voltage generator 280 of FIG. 2. In the first embodiment of FIG. 3A, the body bias voltage generator 280 includes a fifth switch 282 and a sixth switch 284, wherein the fifth switch 282 and the sixth switch 284 are all P-type transistors. A first terminal (an upper end of the fifth switch 282 in FIG. 3A) of the fifth switch 282 is coupled to the first voltage Vin1. A second terminal (a lower end of the fifth switch 282 in FIG. 3A) of the fifth switch 282 is coupled to the bodies of the first switch 262 and the third switch 272 through the body bias voltage node 271. A control terminal (a right end of the fifth switch 282 in FIG. 3A) of the fifth switch 282 is coupled to the input node 291 of the second circuit 290. A first terminal (an upper end of the sixth switch 284 in FIG. 3A) and a second terminal (a lower end of the sixth switch 284 in FIG. 3A) of the sixth switch 284 are respectively coupled to the input node 291 of the second circuit 290 and the second terminal of the fifth switch 282. A control terminal (a left end of the sixth switch 284 in FIG. 3A) of the sixth switch 284 is coupled to the first voltage Vin1. Bodies of the fifth switch 282 and the sixth switch 284 are all coupled to the second terminal of the fifth switch 282. The body bias voltage generator 280 with such configuration can selectively provide a higher one of the first voltage Vin1 and the voltage Y to the body bias voltage node 271.

In the second embodiment of FIG. 3B, the body bias voltage generator 280 includes a seventh switch 286 and an eighth switch 288, wherein the seventh switch 286 and the eighth switch 288 are all N-type transistors. A first terminal (an upper end of the seventh switch 286 in FIG. 3B) of the seventh switch 286 is coupled to the first voltage Vin1. A second terminal (a lower end of the seventh switch 286 in FIG. 3B) of the seventh switch 286 is coupled to the bodies of the first switch 262 and the third switch 272 through the body bias voltage node 271. A control terminal (a left end of the seventh switch 286 in FIG. 3B) of the seventh switch 286 is coupled to the first voltage Vin1. A first terminal (an upper end of the eighth switch 288 in FIG. 3B) and a second terminal (a lower end of the eighth switch 288 in FIG. 3B) of the eighth switch 288 are respectively coupled to the input node 291 of the second circuit 290 and the second terminal of the seventh switch 286. A control terminal (a right end of the eighth switch 288 in FIG. 3B) of the eighth switch 288 is coupled to the input node 291 of the second circuit 290. Bodies of the seventh switch 286 and the eighth switch 288 are all coupled to the ground voltage VSS. The body bias voltage generator

280 with such configuration can selectively provide a higher one of the first voltage Vin1 and the voltage Y to the body bias voltage node 271.

The isolation circuit 250 of the above embodiments can automatically couple or isolate the first circuit 210 and the second circuit 290 according to the first voltage Vin1. When the first voltage Vin1 is equal to the system voltage VDD required for normal operation of the first circuit 210, the first circuit 210 can transmits a signal to the second circuit 290 through the output node 211, the isolation circuit 250 and the input node 291. When the first voltage Vin1 is cut off (for example, the first voltage Vin1 is equal to the ground voltage VSS) to turn off the first circuit 210, another circuit with a similar structure as that of the first circuit 210 can be used to provide the input signal Y to the second circuit 290. Now, the isolation circuit 250 can ensure that the input signal Y provided by the other circuit is not leaked to the first circuit 210 through the output node 211.

The isolation circuit of the present disclosure has various applications. For example, the isolation circuit of the present invention can be applied to a die repairing structure shown in FIG. 4.

Figure 4:
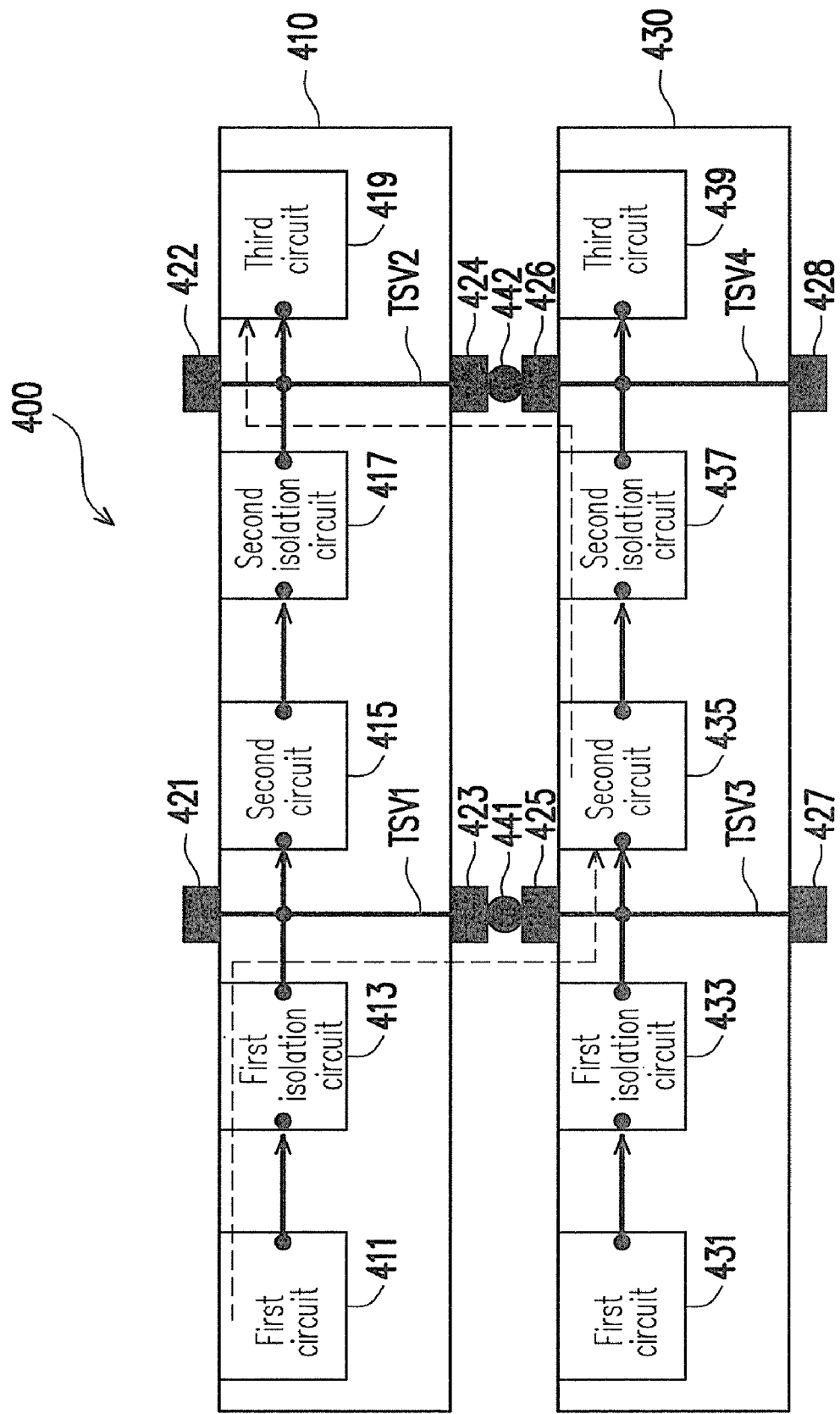
FIG. 4 is a schematic diagram illustrating an application of an isolation circuit according to an exemplary embodiment.

In FIG. 4, a first die 410 and a second die 430 have a same design. The first die 410 includes a first circuit 411, a first isolation circuit 413, a second circuit 415, a second isolation circuit 417 and a third circuit 419. The first isolation circuit 413 is coupled between the first circuit 411 and the second circuit 415, and the second isolation circuit 417 is coupled between the second circuit 415 and the third circuit 419. Moreover, the first die 410 further includes bonding pads 421-424 and through silicon vias (TSV) TSV1 and TSV2.

Similarly, the second die 430 includes a first circuit 431, a first isolation circuit 433, a second circuit 435, a second isolation circuit 437, and a third circuit 439. The first isolation circuit 433 is coupled between the first circuit 431 and the second circuit 435, and the second isolation circuit 437 is coupled between the second circuit 435 and the third circuit 439. Moreover, the second die 430 further includes bonding pads 425-428 and the through silicon vias TSV3 and TSV4.

If the first die 410 and the second die 430 can all be normally operated, coupling of the two dies through the die repairing structure of FIG. 4 is unnecessary, and the four isolation circuits 413, 417, 433 and 437 shown in FIG. 4 are unnecessary to provide the isolation functions.

However, for example, the second circuit 415 of the first die 410, and the first circuit 431 and the third circuit 439 of the second die 430 probably cannot be normally operated due to fabrication flaws or other reasons. Now, to avoid rejecting the first die 410 and the second die 430 to cause a waste, according to the die repairing structure of FIG. 4, a conductive bump 441 can be used to couple the second circuit 435 of the second die 430 to the first isolation circuit 413 of the first die 410, and a conductive bump 442 can be used to couple the third circuit 419 of the first die 410 to the second isolation circuit 437 of the second die 430. Therefore, the first circuit 411 and the third circuit 419 of the first die 410 and the second circuit 435 of the second die 430 can be combined to form a patched circuit 400 that can be normally operated. Now, a signal transmission path is as that shown in dash lines of FIG. 4.

Certainly, to normally operate the patched circuit 400, the circuits 415, 431 and 439 can be disabled by cutting off supplied powers thereof or though other approaches. Moreover, the second isolation circuit 417 of the first die 410 and the first isolation circuit 433 of the second die 430 are required to provide the isolation functions.

However, if the second isolation circuit 417 of the first die 410 and/or the first isolation circuit 433 of the second die 430 cannot substantially provide the isolation function, the patched circuit 400 probably cannot be normally operated. For example, if the first isolation circuit 433 of the second die 430 does not substantially isolate the first circuit 431 of the second die 430, a signal transmitted from the first circuit 411 of the first die 410 to the second circuit 435 of the second die 430 can be leaked into the first circuit 431 of the second die, and such signal leakage may lead to a fact that the patched circuit 400 cannot be normally operated.

If the isolation circuits 413, 417, 433 and 437 of FIG. 4 are implemented by the aforementioned isolation circuit 250, the isolation circuits 413, 417, 433 and 437 can substantially provide the coupling/isolation functions, and each of the isolation circuits 413, 417, 433 and 437 can avoid serving as a signal leakage path between two circuits when the two circuits are required to be isolated. Therefore, if the isolation circuits 413, 417, 433 and 437 of FIG. 4 are implemented by the aforementioned isolation circuit 250, the patched circuit 400 can be normally operated.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An isolation circuit, coupled between an output node of a first circuit and an input node of a second circuit, the first circuit is powered by a first voltage and a second voltage, and the isolation circuit comprising:
   a first switch, having a first terminal coupled to the input node of the second circuit, and a control terminal coupled to the first voltage;
   a second switch, having a first terminal coupled to a second terminal of the first switch, a second terminal coupled to the second voltage, and a control terminal coupled to the first voltage;
   a third switch, having a first terminal and a second terminal respectively coupled to the output node of the first circuit and the input node of the second circuit, and a control terminal coupled to the second terminal of the first switch; and
   a body bias voltage generator, coupled to the first voltage and the input node of the second circuit, and selectively providing a higher one of the first voltage and a voltage on the input node of the second circuit to a body of the third switch.

2. The isolation circuit as claimed in claim 1, wherein the body bias voltage generator selectively provides a higher one of the first voltage and the voltage on the input node of the second circuit to a body of the first switch.

3. The isolation circuit as claimed in claim 1, further comprising a fourth switch, wherein a first terminal and a second terminal of the fourth switch are respectively coupled to the output node of the first circuit and the input node of the second circuit, and a control terminal of the fourth switch is coupled to the first voltage.

4. The isolation circuit as claimed in claim 3, wherein the first switch and the third switch are all P-type transistors, and the second switch and the fourth switch are all N-type transistors.

5. The isolation circuit as claimed in claim 2, wherein the body bias voltage generator comprises:
   a fifth switch, having a first terminal coupled to the first voltage, a second terminal coupled to the body of the first switch and the body of the third switch, and a control terminal coupled to the input node of the second circuit; and a sixth switch, having a first terminal coupled to the input node of the second circuit, a second terminal coupled to the body of the first switch and the body of the third switch, and a control terminal coupled to the first voltage.

6. The isolation circuit as claimed in claim 5, wherein the fifth switch and the sixth switch are all P-type transistors.

7. The isolation circuit as claimed in claim 2, wherein the body bias voltage generator comprises:

a seventh switch, having a first terminal coupled to the first voltage, a second terminal coupled to the body of the first switch and the body of the third switch, and a control terminal coupled to the first voltage; and an eighth switch, having a first terminal coupled to the input node of the second circuit, a second terminal coupled to the body of the first switch and the body of the third switch, and a control terminal coupled to the input node of the second circuit.

8. The isolation circuit as claimed in claim 7, wherein the seventh switch and the eighth switch are all N-type transistors.

9. The isolation circuit as claimed in claim 1, wherein the first voltage is a system voltage, and the second voltage is a ground voltage.

10. An isolation circuit, coupled between an output node of a first circuit and an input node of a second circuit, the first circuit is powered by a first voltage and a second voltage, and the isolation circuit comprising:

a first switch set, coupled to the first voltage and the input node of the second circuit, for coupling a switch control node to the second voltage when the first voltage is at a first voltage level, and coupling the switch control node to the input node of the second circuit when the first voltage is at a second voltage level;

a second switch set, coupled between the output node of the first circuit and the input node of the second circuit, wherein the second switch set is controlled by the switch control node to determine whether or not to isolate the output node of the first circuit from the input node of the second circuit; and a body bias voltage generator, coupled to the first voltage and the input node of the second circuit, wherein the body bias voltage generator selectively provides a higher one of the first voltage and a voltage on the input node of the second circuit to a body of the second switch set.

11. The isolation circuit as claimed in claim 10, wherein the first switch set comprises:

a first switch, having a first terminal coupled to the input node of the second circuit, a second terminal coupled to the switch control node, and a control terminal coupled to the first voltage; and a second switch, having a first terminal and a second terminal respectively coupled to the switch control node and the second voltage, and a control terminal coupled to the first voltage.

12. The isolation circuit as claimed in claim 11, wherein the first switch is a P-type transistor, and the second switch is an N-type transistor.

13. The isolation circuit as claimed in claim 10, wherein the second switch set comprises:

a third switch, having a first terminal and a second terminal respectively coupled to the output node of the first circuit and the input node of the second circuit, and a control terminal coupled to the switch control node.

14. The isolation circuit as claimed in claim 13, wherein the second switch set further comprises:

a fourth switch, having a first terminal and a second terminal respectively coupled to the output node of the first circuit and the input node of the second circuit, and a control terminal coupled to the first voltage.

15. The isolation circuit as claimed in claim 14, wherein the third switch is a P-type transistor, and the fourth switch is an N-type transistor.

16. The isolation circuit as claimed in claim 10, wherein the body bias voltage generator selectively provides a higher one of the first voltage and the voltage on the input node of the second circuit to a body of the first switch set.

17. The isolation circuit as claimed in claim 16, wherein the body bias voltage generator comprises:

a fifth switch, having a first terminal coupled to the first voltage, a second terminal coupled to the body of the first switch set and the body of the second switch set, and a control terminal coupled to the input node of the second circuit; and a sixth switch, having a first terminal coupled to the input node of the second circuit, a second terminal coupled to the body of the first switch set and the body of the second switch set, and a control terminal coupled to the first voltage.

18. The isolation circuit as claimed in claim 17, wherein the fifth switch and the sixth switch are all P-type transistors.

19. The isolation circuit as claimed in claim 16, wherein the body bias voltage generator comprises:

a seventh switch, having a first terminal coupled to the first voltage, a second terminal coupled to the body of the first switch set and the body of the second switch set, and a control terminal coupled to the first voltage; and an eighth switch, having a first terminal coupled to the input node of the second circuit, a second terminal coupled to the body of the first switch set and the body of the second switch set, and a control terminal coupled to the input node of the second circuit.

20. The isolation circuit as claimed in claim 19, wherein the seventh switch and the eighth switch are all N-type transistors.

21. The isolation circuit as claimed in claim 10, wherein the first voltage is a system voltage, and the second voltage is a ground voltage.

* * * * *